(12) United States Patent
Wilde et al.

(10) Patent No.: US 6,410,087 B1
(45) Date of Patent: Jun. 25, 2002

(54) DEPOSITION OF PYROCARBON

(75) Inventors: David S. Wilde, Round Rock; Michael R. Emken, Pflugerville; James A. Accuntius, Georgetown, all of TX (US)

(73) Assignee: Medical Carbon Research Institute, LLC, Austin, TX (US)

( * ) Notice: Subject to any disclaimer, the term of this patent is extended or adjusted under 35 U.S.C. 154(b) by 0 days.

(21) Appl. No.: 09/431,520

(22) Filed: Nov. 1, 1999

(51) Int. Cl.$^7$ .......................... C23C 16/00; C23C 16/26; C23C 16/32

(52) U.S. Cl. .................. 427/249.1; 427/2.15; 427/213; 427/248; 427/255.5

(58) Field of Search ................. 427/2.15, 2.24, 427/2.25, 213, 248.1, 249.1, 255.23

(56) References Cited

U.S. PATENT DOCUMENTS

| | | | |
|---|---|---|---|
| 3,112,220 A | * 11/1963 | Heiser, Jr. et al. | 117/100 |
| 3,253,944 A | * 5/1966 | Wurster | 117/100 |
| 3,398,718 A | 8/1968 | Pilloton | 118/48 |
| 3,566,830 A | 3/1971 | Flamm | 118/48 |
| 3,636,923 A | 1/1972 | McCreary et al. | 118/400 |
| 3,889,631 A | 6/1975 | Lackey et al. | 118/48 |
| 3,940,514 A | 2/1976 | Baker et al. | 427/213 |
| 3,977,896 A | 8/1976 | Bokros et al. | 427/213 |
| 4,080,927 A | 3/1978 | Brown | 118/48 |
| 4,165,568 A | 8/1979 | Gilbert et al. | 34/10 |
| 4,221,182 A | * 9/1980 | Brown | 118/716 |
| 4,335,676 A | 6/1982 | Debayeux et al. | 118/303 |
| 4,342,284 A | 8/1982 | Löser et al. | 118/716 |
| 4,387,120 A | 6/1983 | Barnert | 427/213 |
| 4,546,012 A | 10/1985 | Brooks | 427/213 |
| 5,284,676 A | 2/1994 | Accuntius et al. | 427/8 |
| 5,328,713 A | 7/1994 | Emken et al. | 427/8 |
| 5,328,720 A | 7/1994 | Emken et al. | 427/213 |

FOREIGN PATENT DOCUMENTS

| | | |
|---|---|---|
| GB | 902137 | 7/1962 |

* cited by examiner

Primary Examiner—Shrive P. Beck
Assistant Examiner—Rebecca A. Blanton
(74) Attorney, Agent, or Firm—Fitch, Even, Tabin & Flannery

(57) ABSTRACT

Pyrolytic carbon of extremely uniform crystalline characteristics and essentially free of discontinuities is obtained in a fluidized bed coater by creating an asymmetric recirculation of the fluidized bed within the high temperature coating chamber. Through the use of any of a variety of gas injection schemes, fluidizing/coating gas mixtures are injected through the three-dimensionally curved concave bottom surface of the coater to create a pattern where the fluidized bed ascends within about one-half of the volume of the coater and then spills over to become a descending bed in the other half.

12 Claims, 3 Drawing Sheets

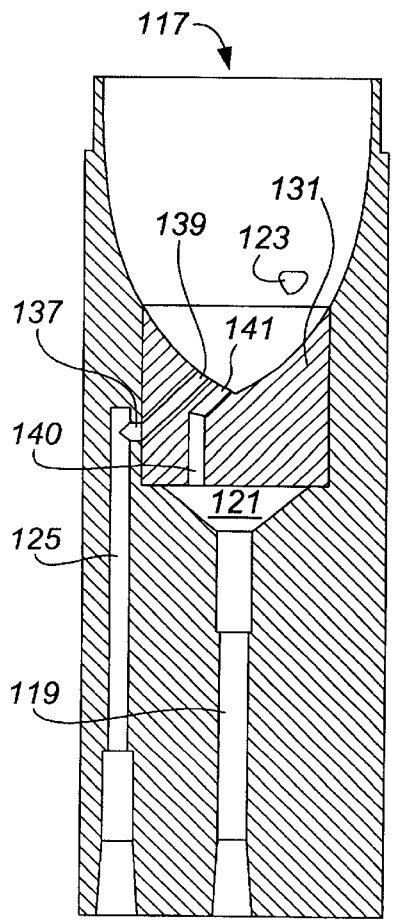

DEPOSITION OF PYROCARBON

The present invention relates generally to the deposition of pyrolytic carbon in fluidized bed converters and more particularly to processes and apparatus for coating substrates in a fluidized bed so as to achieve highly uniform crystalline pyrocarbon coatings thereupon.

BACKGROUND OF THE INVENTION

The process of forming pyrolytic carbon, i.e. pyrocarbon, coatings upon substrates utilizes high-temperature gas-phase dissociation of low molecular weight, saturated or unsaturated, hydrocarbons which undergo polymerization and/or dehydrogenation reactions so as to ultimately form a finely crystalline form of carbon. It is well known to coat substrates with pyrocarbon for various different purposes, and when it is desired that such pyrocarbon coatings completely envelop the substrate in question, the use of a fluidized bed levitation process has become the process of choice.

Investigations have been carried out for over 30 years with respect to the production of pyrocarbons of different characters in fluidized beds, and during this period of time, it has been found that the crystalline character of the pyrocarbon is dependent upon a large number of parameters including deposition temperature, hydrocarbon composition and percentage, contact time of the gas stream with the substrates, and the ratio of surface area to volume in the chamber where coating is taking place. These investigations have determined that the crystalline character and the mechanical strength of the resultant pyrocarbon can be altered by careful manipulation of the foregoing parameters in a fluidized bed process, and there are many U.S. patents which discuss such parameters, e.g. U.S. Pat. Nos. 3,325,363 and 3,547,676.

As a part of these investigations and studies, it was discovered that pyrocarbon of a specific character, i.e. having a relatively high density of at least about 1.5 gm/cm$^3$, having an apparent crystallite size of about 200 Å or less and having high isotropy, exhibited remarkably good properties for use in devices that would have direct or indirect contact with blood in the circulatory system of humans because such pyrocarbon was outstandingly inert and did not give rise to thrombosis. Such pyrocarbon coatings generally became the materials of choice for prosthetic heart valves and other components which would be exposed to the human blood, and U.S. Pat. No. 3,685,059 is indicative of such pyrocarbons. During these early periods, it was felt that such pyrocarbons, in order to provide the desired hardness and high structural strength, should be alloyed with a carbide-forming element, such as the metalloid silicon which would form silicon carbide as a part of the pyrocarbon deposition process. More recently, it has been found that, by depositing pyrocarbon in a fluidized bed under very carefully controlled conditions, as taught in U.S. Pat. No. 5,514,410, pure unalloyed pyrocarbon coatings having high fracture toughness, high strength and high strain-to-failure, as well as adequate hardness, can be created.

Relatively early in the study of such processes for the fluidized bed deposition of pyrolytic carbon, it was determined that the changing character of the usual bed over the length of a normal pyrocarbon coating run, as a natural result of the growing diameters of the small particles in the bed, could have a significant effect upon the crystalline structure of the pyrocarbon being deposited. In this respect, 1976 U.S. Pat. No. 3,977,896 taught an improved process for pyrocarbon deposition in a fluidized bed wherein, through the selective removal and addition of the fluidized particles, the total deposition area within the coating enclosure could be maintained relatively constant, and such would provide improved uniformity in the crystalline characteristics of the pyrocarbon being deposited.

Such careful bed control has continued to be investigated since that time, see for example U.S. Pat. No. 4,546,012. Improvements were made such as are disclosed in U.S. Pat. Nos. 5,284,676 and 5,328,713 where constant monitoring of conditions within the fluidized particle bed is carried out and used to substantially continuously adjust the bed to maintain the precise coating bed character. This results in a precise rate of coating, allowing the thickness of the pyrocarbon deposit to be extremely carefully controlled.

These investigations in processes for the fluidized bed coating of substrates with pyrocarbon have likewise varied the manner of supply of the coating atmosphere to the chamber in which pyrocarbon deposition is occurring. In this respect, the atmosphere is usually a mixture of a vaporous carbonaceous substance and an inert gas which is supplied at a sufficient rate to provide the desired fluidizing effect. Generally, a relatively low molecular weight hydrocarbon, such as propane, propylene, methane or the like, is supplied along with an inert gas, such as nitrogen, argon, helium or the like, through a gas injection arrangement located at the bottom of a vertically oriented chamber wherein the pyrocarbon deposition occurs, as shown in the '896 patent, the '410 patent, the '676 patent, and the '713 patent. The gas injection method of recent choice utilizes a lower nozzle arrangement wherein a gas supply passageway is located on the axis of a generally right circular cylindrical coating chamber and leads to a conical nozzle region which opens smoothly to the full diameter of the cylindrical deposition chamber. Such a construction has generally been the nozzle construction of choice during about the last two decades for depositing pyrocarbon coatings upon small components, such as valve bodies and occluders for heart valves, although some other arrangements have been disclosed and presumably utilized to some extent. The operation of such construction of choice is generally illustrated in the '676 patent, where it is shown that the ascending portion of the fluidized bed is located vertically above the incoming gas passageway, with the returning particles in the bed descending along the outer periphery and then being directed, by the conical shape of the nozzle region, back into the center where they are again levitated upward. This arrangement is commonly referred to as a spouting bed.

As examples of other proposed gas injection arrangements, reference is made to the following U.S. patents. U.S. Pat. No. 5,328,720 discloses the use of a substantially flat grid, which contains a plurality of essentially uniformly disposed straight passageways, located above a distribution-type entrance region. U.S. Pat. No. 3,889,631 shows a variety of gas distribution plates with passageways of various exit shapes that are distributed symmetrically about the area of the plate, and U.S. Pat. Nos. 3,398,718 and 4,387,120 are generally similar. U.S. Pat. No. 3,636,923 discloses the more common conical nozzle region; however, it also incorporates a more elaborate gas distributor, as best seen in FIG. 2. U.S. Pat. No. 4,342,284 shows a variety of gas injectors which have some general similarity to the arrangement shown in the '923 patent. U.S. Pat. No. 4,335,676 discloses another type of injector for introducing a gaseous flow into the bottom of a spouting bed coating chamber of this general type wherein the particles move upward in the form of a spout or geyser and then fan radially out toward the surrounding wall of the enclosure; it includes the usual conical section to accommodate the return of the descending particles in the bed. U.S. Pat. Nos. 3,566,830 and 4,221,182 disclose other arrangements which bear a general similarity to that shown in the '676 patent.

U.S. Pat. No. 4,080,927 discloses an alternative arrangement to that shown in the '182 patent which is adapted for coating small spheroids with pyrocarbon in a fluidized bed. A levitating gas, such as argon, helium or nitrogen, is injected separately into the coating chamber through a plurality of passageways 14 (supplied via an entrance chamber 28), while the reactant gas, i.e. a hydrocarbon, is injected through a central nozzle 18 having a plurality of discharge passageways 20. A variety of different nozzles are disclosed in FIGS. 6–11. U.S. Pat. No. 3,940,514 shows a fluidized bed coater where a bed of particles having the usual spouted bed configuration are coated with a liquid which is being injected into and atomized within a coating chamber.

Although various of the aforementioned improvements have rendered the process of coating with pyrocarbon far more efficient, the search has continued for still better processes, particularly ones which facilitate the deposition of highly uniform crystalline pyrocarbon.

SUMMERY OF THE INVENTION

Processes and apparatus for depositing pyrolytic carbon in a fluidized bed in a generally vertically oriented coating chamber are provided which are efficient and which result in the deposition of highly uniform crystalline pyrocarbon upon the substrates. The usual gaseous atmosphere, containing an inert carrier gas and a hydrocarbon or the like, is injected into the chamber at a lower location, and the chamber is heated to a temperature such that the hydrocarbon pyrolytically decomposes at the surfaces of the substrates being levitated in the fluidized bed, depositing pyrocarbon thereupon. The injection of the gaseous atmosphere is carried out in a manner so that an ascending fluidized bed region is established along one boundary portion of the chamber and a descending fluidized bed region is established along an opposite boundary portion of the chamber; this flow pattern is referred to as asymmetric and departs radically from the typical symmetrical spouting bed arrangement that has been employed for decades. As a result, there is minimization of stagnant locations within the fluidized bed portion of the coating chamber and a faster transit of the substrates being coated through the regions of the bed where temperature and gas concentration gradients inevitably occur, as a result of which the pyrocarbon coatings are deposited which are essentially free of discontinuities such as minor voids, cracks and soot bands and have highly uniform crystallinity.

BRIEF DESCRIPTION OF THE DRAWINGS

FIGS. 3 and 4 are sectional views taken through another nozzle block arrangement embodying various features of the invention.

FIG. 5 is a bottom view of the nozzle block showing the section lines along which FIGS. 3 and 4 were taken.

FIGS. 6 and 7 are nozzle block inserts of alternative designs that might be substituted into the nozzle block shown in FIGS. 3–5.

FIG. 8 is a top view of the insert of FIG. 7.

FIGS. 9 and 10 are sectional views similar to FIGS. 6 and 7 showing further alternative designs of nozzle block inserts.

DETAILED DESCRIPTION OF THE PREFERRED EMBODIMENTS

Figure 1:
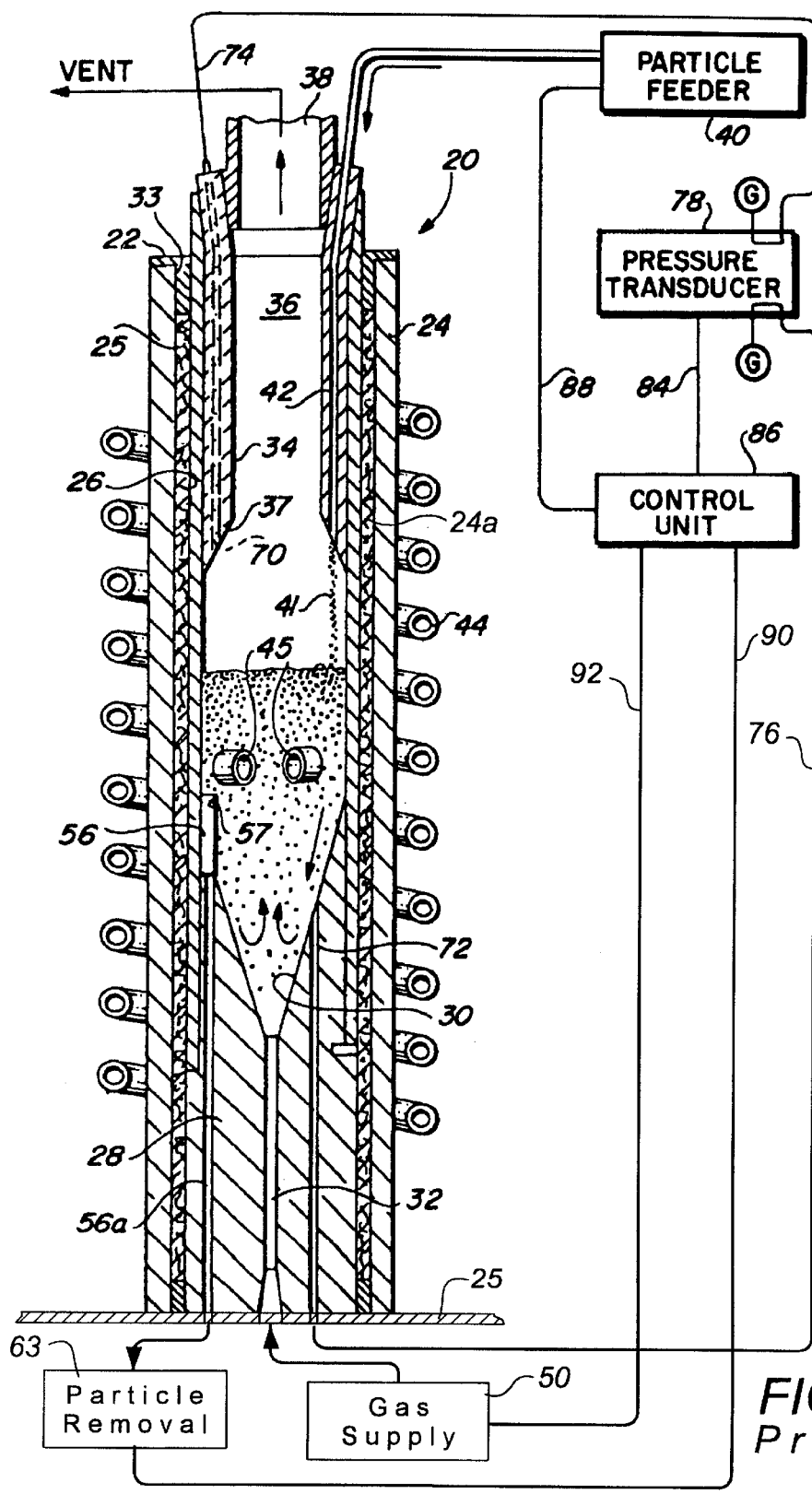
FIG. 1 is a schematic view, partially in section, of a prior art fluidized bed apparatus for depositing pyrolytic carbon coatings upon objects being levitated in association with the bed of particles.
Figure 2A:
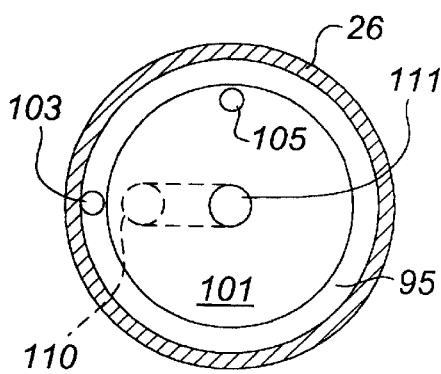
FIG. 2A is a section view taken along the lines 2A—2A of FIG. 2.

Illustrated in FIG. 1 is a prior art fluidized bed coating apparatus 20 which includes a furnace 22 having an outer cylindrical shell 24 within which a coating enclosure is located. Details of the construction and operation of the fluidized bed coating apparatus are set forth in U.S. Pat. No. 5,284,676, the disclosure of which is incorporated herein by reference. The furnace 22 is supported upon a water-cooled support plate 25 to which it may be bolted. A coating enclosure is generally separated from the outer cylindrical shell 24 by a layer of insulation 24a and is defined by an elongated sleeve 26 which fits about the upper end portion of a lower nozzle block 28 that has an interior conical bottom surface 30 which extends upward from a vertical central passageway 32 that is coaxial with the exterior of the nozzle block and the elongated tube 26, both of which are circular in cross-section. The upper end of the furnace includes an annular spacer 33, which centers the coating tube or sleeve 26, and an upper insert 34 that defines a central exit passageway 36. The insert 34 has a frustoconical bottom surface and several passageways in its thickened wall. The heated levitating and coating gases leaving the fluidized bed coater travel through this exit passageway 36 and through a suitable conduit 38 leading to an appropriate vent.

A particle feeder 40 is mounted generally above the fluidized bed coater 20 and is designed to feed minute particles 41 into the coating enclosure at a desired rate. The particles from the feeder 40 enter the coater through an entrance conduit provided by one of the passageways 42 in the wall of the insert. A suitable induction or alternating current heating device 44 is located in surrounding relationship to the furnace tube; it heats the active deposition region of the coating enclosure as well as the small particles and the objects being levitated to bring them to the desired temperature at which pyrolytic deposition occurs.

A coating operation is usually carried out by first establishing a levitated bed of minute particles of submillimeter size. This spouting bed arrangement is maintained in the lower section of the coating chamber as illustrated. If separate objects are to be coated along with the particles that comprise the bed, for example annular heart valve bodies 45, they are appropriately loaded into the bed through the upper exit passageway 36; they are supported among the fluidized particles in the bed being levitated by the upwardly flowing gaseous stream. The temperature within the coating enclosure is appropriately monitored and controlled to heat the particles and the substrates to the desired temperature.

When the coating process is ready to begin, a carbonaceous substance, preferably a gaseous hydrocarbon such as propane, propylene, methane, etc. or a mixture thereof, is added to the fluidizing gas stream. The supply of the gaseous mixture is handled through flow-regulating valve arrangements that are part of a gas supply system 50 which operates to appropriately mix the hydrocarbon and the fluidizing gas. In the illustrated arrangement, the gas being supplied flows upward through the central passageway 32 and creates a generally toroidal flow pattern within the coating enclosure, with the particles and substrates flowing upward in a central region of the bed and fanning out over 360° at the top of the bed before returning along the interior cylindrical sidewall of the tube 26. The symmetrical flow pattern is sometimes referred to as a spouting bed.

In many instances the primary object of the coating operation will be to coat the exterior surfaces of the small substrates in the bed of supporting particles with a uniform coating of pyrocarbon, and it must be understood that the character of the bed is constantly changing because the minute particles in the bed grow in size as a result of the coating that is occurring. For coating with pyrocarbon, an amount of small particles, i.e. spheroids, will be provided having sufficient total surface so that there will be at least about 70 sq. cm of surface for each cu. cm of volume in the active coating region. Generally, such ancillary particles are about 1,500 microns ($\mu$m) or less in size and preferably have an average size not greater than about 800 microns. In order to maintain the desired bed character, some particles are generally continuously removed from the bed, and new particles (which are substantially smaller in size) are generally continuously added. Particle removal is effected through an exit conduit 56 having an exit hole 57 in its side wall, and particles that enter this conduit fall by gravity through the passageway 56a in the nozzle block 28. They ultimately pass through a hole in the support plate 25 and enter a particle removal system 63 where they are collected and weighed. As previously indicated, they are replaced with particles 41 of smaller size that are supplied by the particle feeder 40 and enter an upper region of the fluidized bed.

In the illustrated arrangement, the size of the fluidized bed within the coating enclosure is carefully regulated in order to precisely control the character of the pyrocarbon being deposited. Control is effected by measuring the pressure differential across the fluidized bed by monitoring the pressure difference between a point at a lower region in the bed or below the bed and a point above the bed. To this end, an upper pressure-sensing port 70 is provided in the upper insert 34, and a lower pressure-sensing port 72 is provided at the end of a long passageway in the nozzle block 28. The upper port 70 and the lower port 72 are respectively connected via tubing 74, 76 to a pressure transducer 78 for measuring the pressure at these ports and then comparing the two pressures measured to determine the difference therebetween. To keep the ports and tubing clear of dust, carbonaceous material and the like, an appropriate slow purge flow of inert gas is maintained through both port systems. A signal from the pressure transducer 78 is sent via a line 84 to a control unit 86 which instigates appropriate adjustments by sending signals to the particle removal system 63 and the particle feeder 40 through lines 88 and 90. The control unit 86 also controls the gas supply system 50, sending signals via a line 92.

As earlier mentioned, it has now been found that improvements can be made in fluidized bed pyrocarbon coating by departing from the traditional spouting bed pattern of coating, which has an inherent propensity to create regions of stagnation in the bed where substrates being coated can become momentarily trapped, as well as regions where concentration gradients will occur as a result of which the substrates will be momentarily exposed to either richer or leaner hydrocarbon concentrations that can affect the crystallinity of the pyrocarbon being created and deposited. It has now been found that substantial improvements in uniformity are obtained by causing an asymmetric flow pattern to be created within the coating chamber, where the fluidized bed ascends along one boundary portion of the coating chamber and descends along the opposite boundary portion thereof. In actuality, the ascending bed in the right half of the coating chamber (as viewed in FIG. 2), after reaching he top, will pour over toward the diametrically opposite boundary along which the particles and substrates return to the bottom surface.

Figure 2:
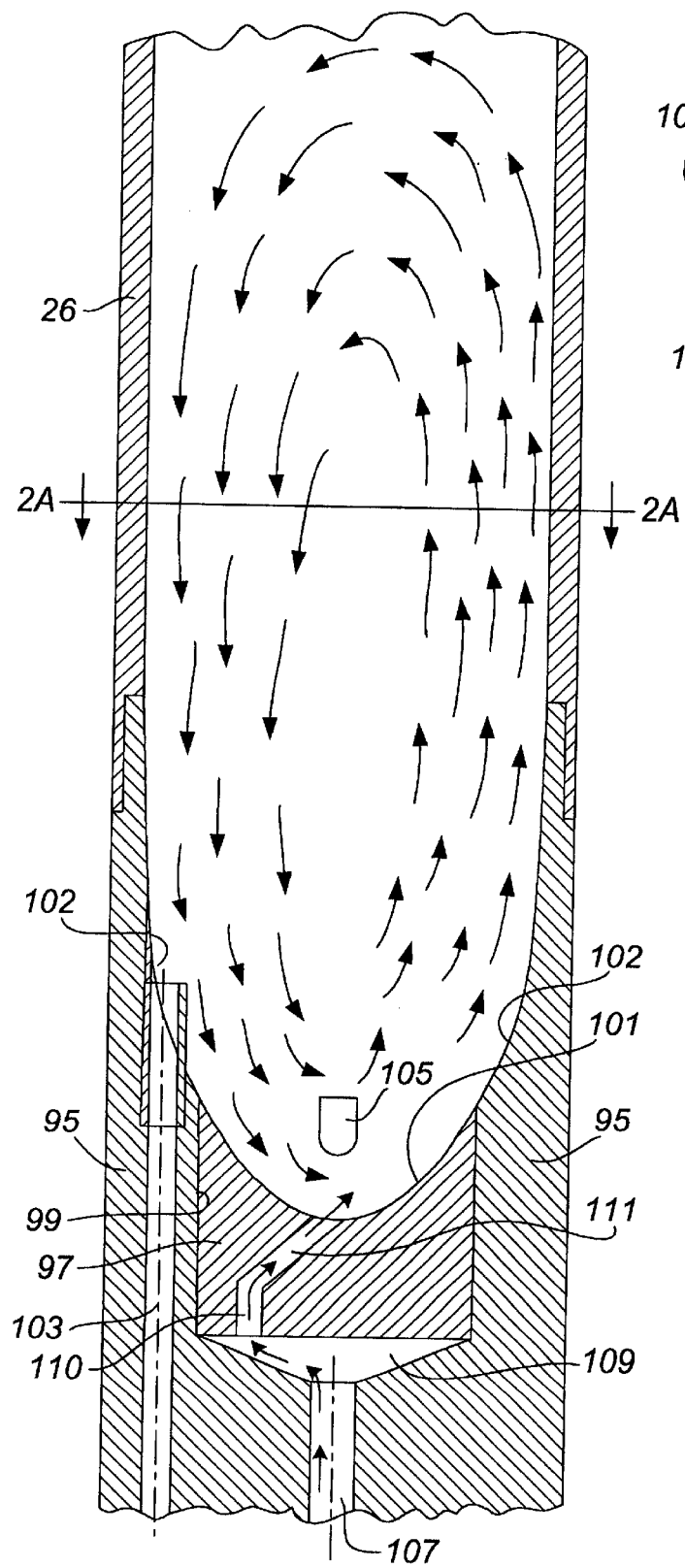
FIG. 2 is an enlarged fragmentary sectional view of the coating chamber of the apparatus shown in FIG. 1 wherein there is substituted a nozzle block arrangement embodying various features of the present invention.

Illustrated in FIG. 2 is a substitute nozzle block section 95 that might be used as a part of the overall fluidized bed coater 20 shown in FIG. 1 in order to establish the desired asymmetric recirculation pattern within the coating chamber. The nozzle block 95 includes a central insert 97 that is of generally cylindrical shape and fits in a cavity 99 coaxially formed in the block; the insert provides a concave bottom surface 101 for the lower region of the coating chamber, which surface is smoothly continued in the interior surface 102 of the upper region of the block.

The block 95 mates with the bottom of the furnace tube 26 and is suitably bolted to the upper surface of the support plate 25; it contains three passageways that mate with passageways provided in the support plate. A left-hand passageway 103 is the equivalent of the particle discharge passageway 56a of the FIG. 1 installation. A pressure monitoring port 105 is connected via a suitable passageway similar to the passageway 72 to an opening in the support plate through which the connection to the pressure transducer 78 is made. A slow flow of purge gas is fed through port 105. A central passageway 107 which leads into a central chamber 109 in the block 95 which is at the lower end of the cavity 99 and serves as the gas inlet passageway so that the gas supply system causes a mixture of hydrocarbon and fluidizing gas, e.g. nitrogen, to be fed upward through this passageway. The insert 97 has a short lower vertical passageway section 110 which connects to an upper section 111 that is angled at about 40° from the horizontal through which the mixed flow of fluidizing gas and hydrocarbon is fed at an angle upward and to the right as shown in FIG. 2.

Because the stream of gas being supplied to the coating chamber is supplied through the angled passageway 111, an asymmetric flow circulation pattern for the fluidized bed is created. When viewed in the cross-sectional plane along which FIG. 2 is taken, the flow pattern is generally oval. The particles and substrates being coated are levitated upward along the right-hand boundary of the coating chamber by the flow of gas from the passageway 111 which travels upward along the three-dimensionally curved surfaces 101 and 102. When the particles reach the top, they in essence spill over onto the opposite left-hand boundary portion, becoming a descending fluidized bed because the upward flow of gas in this region is minimal compared to that along the right-hand boundary. The central concave surface of the insert 97 surrounds the angled gas inlet opening 111 and serves as the bottom surface for the coating chamber. The remainder of the upper surface of the nozzle block includes the concave annular surface 102 that provides a smooth transition from the vertical sidewall of the tube 26 to the concave surface of the insert.

The concave surface 101 of the insert 97 is ovoid-shaped, and the adjacent section 102 of the nozzle block is essentially a continuation thereof. This three-dimensionally curved, ovoid shape directs the descending particles and substrates back to the centerline of the nozzle block with a momentum that carries them across the centerline plane where the flow of gas through the angled inlet causes them to begin to ascend in the right-hand boundary region where they are again levitated to the upper region of the fluidized bed. This arrangement has been found to provide surprising uniformity and a significant decrease in discontinuities that might otherwise occur in coatings that are applied using a standard, spouting horn type of coating apparatus. Moreover, the widening of the coating region at the bottom of the nozzle block, as compared to the usual conical region shown in FIG. 1, increases the working volume of a coater of a given size. Although there will always be some regions where temperature variations inherently will exist in a dynamic coater such as this, the asymmetrical flow pattern that is created not only eliminates stagnation but creates a more rapid circulation through the different zones of the coating chamber which minimizes any consequential effect of residence in regions of different temperatures or different carbon concentrations.

Illustrated in FIGS. 3, 4 and 5 is a second alternative nozzle block 117 that might be employed instead of the block illustrated in FIG. 2. The block 117 includes a central gas flow passageway 119 which carries the flow of fluidizing gas and leads to a plenum or chamber 121 and a passageway 123 that serves the particle removal function of the passageway 56a of FIG. 1. The positioning of the passageway 123 shows that the particle-removal passageway can be placed at various angular locations around the bottom of the chamber and will still operate effectively. An offset vertical passageway 125 serves as the main hydrocarbon inlet passageway. In addition, as can be seen from FIG. 4 and bottom view FIG. 5, there are three threaded holes 127 provided in the bottom of the nozzle block 117 which allow it to be bolted in place using bolts that extend through the support plate 25.

As in the case of the nozzle block 95 of FIG. 2, a cylindrical recess or cavity 129 is centrally located which receives a nozzle insert 131 which has a concave upper surface 133 of three-dimensional curvature which is shaped to be a continuation of the interior sidewall 135 at the upper end of the block. The shape is that of a section of an ovoid having a pointed end, generally similar to the shape of an American football. The hydrocarbon inlet passageway 125 has a side outlet 137 that extends to the sidewall of the recess where it joins the lower end of an angled hydrocarbon injection passageway 139 formed in the insert 131 that leads upward to the concave interior surface 133 at a generally similar angle to the horizontal as the passageway 111. The nozzle insert 131 contains a dogleg passageway 141 which includes a vertical leg 140 that connect to an the angled leg 141 which is parallel to the passageway 139 but located vertically below it.

The circulation pattern of a fluidized bed created within a coater using the nozzle block 117 of FIG. 3 is substantially the same as that shown in FIG. 2. Both of the inlet passageways 139 and 141 are located at an angle of between about 40° and 50° to the horizontal, and they serve to discharge the streams of hydrocarbon gas and inert fluidizing gas, e.g. nitrogen, fairly smoothly up the right-hand region of the lower section of the coater to create the desired fluidization pattern. Because pyrolysis of hydrocarbon is the basis of the creation of these pyrocarbon coatings, a gradual buildup of pyrocarbon will occur in the nozzle insert itself which will of necessity limit its hours of use. However, it has been found that, by splitting the flows of fluidizing gas and hydrocarbon gas so that the primary flow of fluidizing gas is vertically below the stream of hydrocarbon gas being discharged into the coating region, pyrolysis on the surface of the insert is minimized and the useful life of a nozzle is significantly extended. It is believed that the illustrated arrangement generally isolates the incoming hydrocarbon stream from direct contact with the hot surface of the insert at the bottom of the coating chamber and thus prevents such potentially clogging pyrolysis at the graphite surface. The hydrocarbon stream may be slightly diluted with nitrogen, for control purposes; preferably, the major portion of the fluidizing gas is injected through the separate inlet 141. As previously indicated, this asymmetric circulating operation is quite efficient because the descending particles are caused, by the three-dimensional curvature of the bottom surface 135, 133 to move smoothly into the path of the two gas streams being injected.

In this arrangement, the central passageway 119 and its interconnected dogleg passageway 140, 141 can also be used to accomplish the monitoring of the pressure at the very bottom of the coater. The flow of the inert fluidizing gas, e.g. nitrogen, does not deter the use of the passageway system for the pressure monitoring arrangement as described in the 676 patent; however, if desired, a separate port could be provided similar to the port 105 described hereinbefore.

Illustrated in FIG. 6 is an alternative embodiment of an insert 145 that might be employed in a nozzle block 117 generally similar to that shown in FIGS. 3 and 4. The insert 145 has a concave upper surface 147 that is generally hemispherical, although it could be characterized as being a section of a somewhat flattened ovoid. The insert includes a single dogleg angled passageway 148 which emerges on about the centerline of the insert. The terminal section of the passageway 149 is oriented at about 40° from the vertical and is slightly larger in diameter than the passageway 141. High temperature resistant tubing 149 runs coaxially through the terminal section of the passageway and out the side of the insert 145 where it connects to a passageway (not shown) similar to the passageway 125. The hydrocarbon gas flow is supplied to the coating chamber via the central tubing 149 and thus is surrounded by the coaxial flow of the fluidizing gas, e.g. nitrogen, which is supplied through the dogleg passageway 148. Thus, the flow of the stream of hydrocarbon is excellently blanketed or shielded from the surrounding refractory material of the insert 145 at the point of the nozzle, and clogging as a result of slow pyrocarbon deposition in this region is minimized.

Particle removal could be through a conduit 150 similar to the passageway 123; however, preferably the passageway is located at about the centerline plane of the chamber (perpendicular to the plane on which the section view of FIG. 6 is taken) which generally divides the ascending and descending regions of the bed. If a similar pressure control were to be used to control the coating operation, then an ancillary pressure port could be provided on the opposite side of the chamber, offset 180° from the particle-removal port, or alternatively the dogleg passageway might be used. Again, the descending particles in the left-hand region above the insert will transition along the three-dimensionally curved concave surface 147 to the center of the bottom surface where they will be levitated by the combined gas stream inflowing through the angled passageway 148 and the coaxial tube 149.

Illustrated in FIGS. 7 and 8 is another alternative insert 151 which could be substituted for that shown in FIG. 6. The insert 151 has a generally hemispherical or flattened ovoid upper surface 153 and contains a plurality of vertical passageways 155 which are arranged generally along the centerline plane and on the right-hand side thereof. All five of these passageways 155 are supplied with a mixed stream of gas from the chamber 121 in the nozzle block that serves as a plenum; this creates a plurality of upflowing gas streams in the right-hand region of the coating chamber that create the asymmetric ascending/descending fluidized bed pattern shown in FIG. 2. As before, the descending particles are directed to the center of the three-dimensionally curved bottom surface where they are entrained by the upflowing gas streams to create the desired recirculation pattern.

Illustrated in FIG. 9 is still another alternative construction of a nozzle block 161 which has an upper surface 163 that can be generally hemispherical or that of a section of a flattened ovoid. A pair of parallel vertical passageways 165, 167 are provided in the nozzle block 161. The passageway 165 carries the hydrocarbon which, as indicated hereinbefore, may be slightly diluted with nitrogen; it is at or offset just slightly from the centerline of the block. The passageway 167 carries the fluidizing gas; it is offset to the right of the parallel passageway 165. This arrangement also creates the asymmetric ascending/descending fluidized bed pattern shown in FIG. 2, and the entry of the fluidizing gas so as to flow generally between the hydrocarbon stream and the chamber wall serves to minimize pyrolysis of the hydrocarbon at the surface of the nozzle that would otherwise result in clogging following several coating runs. In essence, the separate fluidizing gas stream serves to blanket the flow of hydrocarbon.

Although simply from a machining standpoint, the use of nozzle blocks and inserts within those blocks that have concave surfaces that are generally symmetrical are preferred, symmetry although preferred is not considered to be a requirement, as the desired asymmetric circulation pattern of a fluidized bed can be achieved using a nozzle arrangement having an asymmetric bottom surface. Shown in FIG. 10 is such an insert 171 that might alternatively be used in the nozzle block 117 shown in FIGS. 3–5. The insert 171 has an asymmetric, three-dimensionally curved, concave surface 173 wherein the radius of curvature is lesser in the bottom region below the ascending portion of the fluidized bed on the right-hand side and then flattens out. Illustrated is a single vertical passageway 175 that is located in the right-hand portion of the asymmetric surface below what will be the ascending portion of the fluidized bed, and discharge upward of the mixed gas stream through the passageway 175 is effective to create the desired asymmetric ascending/descending fluidized bed pattern shown in FIG. 2. Alternatively, a pair of gas passageways could be used such as the passageways 165, 167.

Figure 11:
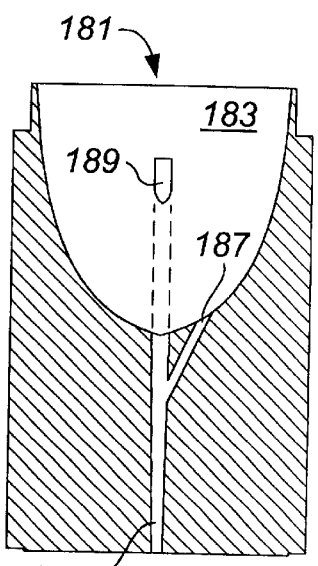
FIG. 11 is a section view similar to FIG. 3 showing still another alternative nozzle block design.

Depicted in FIG. 11 is an alternative embodiment of a nozzle block similar to that shown in FIGS. 3 and 4 which is made of one-piece construction. The upper end of the nozzle block 181 is designed to interfit with the lower end of the furnace tube 26, and it contains a three-dimensionally curved ovoid surface 183 similar to that surface 133, 135 shown in FIGS. 3 and 4. A single passageway 185 extends vertically through the nozzle block from its bottom surface and is designed to carry a mixed stream of hydrocarbon and fluidizing gas as hereinbefore described. At its upper end, there are one or more branch passageways 187 which extend at an angle to the vertical toward the right-hand side. The combination of these upward angled outlets creates the desired asymmetric ascending/descending fluidized bed pattern shown in FIG. 2. A particle-removal port 189 is located on the coating chamber centerline plane which essentially divides the ascending and descending portions of the fluidized bed. A similar pressure-monitoring port (not shown) is preferably located so that it opens onto the ovoid surface of the bottom section of the coating chamber along the opposite edge of the centerline plane, offset 180° from the particle-removal port 189.

In operation, as taught in the aforementioned U.S. patents, a coater having an interior diameter of about 3½ inches may be operated with an initial charge of about 250 to about 700 grams of pyrolytic carbon-coated zirconium dioxide particles having sizes between about 325 microns and about 850 microns. Using an operating temperature of about 1400° C., once the fluidized bed is established, a mixture of about 40% propane and about 60% nitrogen at a flow rate of about 20 liters per minute is fed through the coater to coat valve bodies for prosthetic heart valves having a height, for example, of about 1 cm and an OD of between about 1.6 and 2.6 cm. The coating operation is often carried out for about 180 minutes to create a pyrocarbon coating on the graphite substrates of about 0.01 inch in thickness.

Although the invention has been described with regard to a number of preferred embodiments which constitute the best mode present known to the inventors for carrying out the invention, it should be understood that various changes and modifications as would be obvious to one having the ordinary skill in this art may be made without departing from the scope of the invention that is set forth in the claims appended hereto. For example, although the illustrated coaters employ coating chambers that are of true circular cross-section, a coating apparatus of generally circular cross-section may be used to achieve the desired effect of such an asymmetric circulation pattern. For example, the cross-section could be polygonal or elliptical with the short axis of the ellipse generally defining the centerline plane which divides the ascending and the descending halves. Although some of the illustrated nozzle blocks utilize pressure measuring ports in order to control the coating operation in that fashion, it should be understood that this is likewise not a requirement and that other methods of bed control can be used, for example the weight measurement method described in the '713 patent. The disclosure of the U.S. patents referred to hereinbefore are incorporated herein by reference.

Particular features of the invention are emphasized in the claims that follow.

What is claimed is:

1. In a process for depositing pyrolytic carbon from a gaseous atmosphere in a defined region having a bottom surface and a generally vertical lateral boundary, which process includes the steps of injecting a gaseous atmosphere into a lower portion of said defined region so as to levitate small substrates present when said region, said atmosphere including an inert carrier gas and a carbonaceous substance, and heating said defined region and said levitated substrates to a temperature such that said carbonaceous substance pyrolytically decomposes to deposit pyrolytic carbon upon the surfaces of said substrates, the improvement which comprises injecting said gaseous atmosphere into said defined region as a plurality of individual streams so as to create an asymmetric ascending and descending fluidized bed in opposite halves of said defined region with a first one of said individual streams including said carbonaceous substance and a second one of said streams consisting essentially of inert carrier gas, and with said second stream being injected in a location so as to initially flow in a region between said first stream and the boundary surface along which it upwardly flows, whereby uniform pyrolytic carbon coatings are deposited upon said substrates.

2. The process according to claim 1 wherein said substrates comprise spheroidal particles about 1,500 microns or less in size and components of a substantially greater size.

3. In a process for depositing pyrolytic carbon from a gaseous atmosphere in a defined region having a bottom surface and a generally vertical lateral boundary, which process includes the steps of injecting a gaseous atmosphere into a lower portion of said defined region so as to levitate small substrates present within said region, said atmosphere including an inert carrier gas and a carbonaceous substance, and heating said defined region and said levitated substrates to a temperature such that said carbonaceous substance pyrolytically decomposes to deposit pyrolytic carbon upon the surfaces of said substrates, the improvement which comprises injecting said gaseous atmosphere into said defined region so as to create an asymmetric ascending and descending fluidized bed in opposite halves of said defined region with said carbonaceous substance being injected in a first stream that is generally coaxial with and surrounded by a second stream that is substantially entirely inert carrier gas, whereby uniform pyrolytic carbon coatings are deposited upon said substrates.

4. The process according to claim 3 wherein said substrates comprise spheroidal particles about 1,500 microns or less in size and components of a substantially greater size.

5. In a process for depositing pyrolytic carbon from a gaseous atmosphere in a defined region having a bottom surface and a generally vertical lateral boundary, which process includes the steps of injecting a gaseous atmosphere into a lower portion of said defined region so as to levitate small substrates present within said region, said atmosphere including an inert carrier gas and a carbonaceous substance, and heating said defined region and said levitated substrates to a temperature such that said carbonaceous substance pyrolytically decomposes to deposit pyrolytic carbon upon the surfaces of said substrates, the improvement which comprises injecting said gaseous atmosphere into said defined region generally centrally of said bottom surface of said defined region as a stream which is oriented at an angle to the vertical and directed toward one vertical boundary surface so as to create an asymmetric ascending and descending fluidized bed in opposite halves of said defined region whereby uniform pyrolytic carbon coatings are deposited upon said substrates.

6. The process according to claim 5 wherein said stream is injected at an angle of at least about 30° from the vertical.

7. The process according to claim 6 wherein said defined region is generally circular in horizontal cross-section.

8. The process according to claim 5 wherein said substrates comprise spheroidal particles about 1,500 microns or less in size and components of a substantially greater size.

9. A process for depositing pyrolytic carbon from a gaseous atmosphere in a defined region which is generally circular in horizontal cross-section and has a bottom surface and a generally vertical lateral boundary, which process comprises injecting a gaseous atmosphere, which includes an inert carrier gas and a carbonaceous substance, into said defined region through said bottom surface which has three-dimensional, generally hemispheroidal or ovoid concave shape so as to levitate small spheroids and components of a size greater than said spheroids, and to create an ascending fluidized bed including said components within one boundary portion of said defined region and a descending fluidized bed within an opposite boundary portion thereof, and heating said defined region and said levitated substrates to a temperature such that said carbonaceous substance pyrolytically decomposes to deposit pyrolytic carbon upon the surfaces of said spheroids and components, whereby highly uniform crystalline pyrolytic carbon is deposited upon said spheroids and components as a result of minimizing temperature and gas concentration gradients which results in uniform decomposition of said carbonaceous substance throughout said fluidized bed.

10. The process according to claim 9 wherein said small spheroids comprise particles about 1,500 microns or less in size.

11. The process according to claim 9 wherein said gaseous atmosphere is injected as a stream through an inlet located off-center of said bottom surface of said defined region.

12. The process according to claim 9 wherein said gaseous atmosphere is injected through said bottom surface as a plurality of individual streams which are oriented to create a resultant upward flow of gas generally within said one boundary region.

* * * * *

UNITED STATES PATENT AND TRADEMARK OFFICE
CERTIFICATE OF CORRECTION

PATENT NO. : 6,410,087 B1
DATED : June 25, 2002
INVENTOR(S) : David S. Wilde et al.

It is certified that error appears in the above-identified patent and that said Letters Patent is hereby corrected as shown below:

Column 10,
Line 46, replace "when" with -- within --.

Signed and Sealed this

Eighteenth Day of February, 2003

JAMES E. ROGAN
*Director of the United States Patent and Trademark Office*